US007561699B2

(12) United States Patent
Jot et al.

(10) Patent No.: US 7,561,699 B2
(45) Date of Patent: Jul. 14, 2009

(54) ENVIRONMENTAL REVERBERATION PROCESSOR

(75) Inventors: Jean-Marc Jot, Aptos, CA (US); Sam Dicker, Santa Cruz, CA (US); Luke Dahl, Santa Cruz, CA (US)

(73) Assignee: Creative Technology Ltd, Singapore (SG)

( * ) Notice: Subject to any disclaimer, the term of this patent is extended or adjusted under 35 U.S.C. 154(b) by 1057 days.

(21) Appl. No.: 10/973,152

(22) Filed: Oct. 26, 2004

(65) Prior Publication Data

US 2005/0058297 A1 Mar. 17, 2005

Related U.S. Application Data

(63) Continuation of application No. 09/782,908, filed on Feb. 12, 2001, now Pat. No. 6,917,686, which is a continuation of application No. 09/441,141, filed on Nov. 12, 1999, now Pat. No. 6,188,769.

(60) Provisional application No. 60/108,244, filed on Nov. 13, 1998.

(51) Int. Cl.
*H03G 3/00* (2006.01)

(52) U.S. Cl. .............................. 381/63; 84/630; 84/707

(58) Field of Classification Search ................... 381/61, 381/63; 84/630, 707
See application file for complete search history.

(56) References Cited

U.S. PATENT DOCUMENTS

| | | | | |
|---|---|---|---|---|
| 4,731,848 | A | 3/1988 | Kendall et al. | |
| 4,817,149 | A | 3/1989 | Myers | |
| 4,937,875 | A * | 6/1990 | Hayashi | 381/63 |
| 5,073,942 | A * | 12/1991 | Yoshida et al. | 381/61 |
| 5,436,975 | A | 7/1995 | Lowe et al. | |
| 5,555,306 | A | 9/1996 | Gerzon | |
| 5,559,891 | A * | 9/1996 | Kuusama et al. | 381/63 |
| 5,666,136 | A | 9/1997 | Fujishita et al. | |
| 5,812,674 | A | 9/1998 | Jot et al. | |
| 5,835,093 | A * | 11/1998 | Fujishita et al. | 715/727 |
| 6,067,072 | A * | 5/2000 | Fujishita et al. | 715/727 |
| 6,917,686 | B2 | 7/2005 | Jot et al. | |
| 2008/0137875 | A1* | 6/2008 | Zong et al. | 381/63 |

OTHER PUBLICATIONS

Jot, et al., "Analysis and Synthesis of Room Reverberation Based on a Statistical Time-Frequency Model", 103rd Convention of Audio Engineering Society, Sep. 26-29, 1997, New York, NY.

* cited by examiner

*Primary Examiner*—Xu Mei
(74) *Attorney, Agent, or Firm*—Schwegman, Lundberg & Woessner, P.A.; Gregory J. Gorrie

(57) ABSTRACT

A method and apparatus for processing sound sources to simulate environmental effects includes source channel blocks for each source and single reverberation block. The source channel blocks include direct, early reflection, and late reverberation blocks for conditioning the source feeds to include delays, spectral changes, and attenuations depending on the position, orientation and directivity of the sound sources, the position and orientation of the listener, and the position and sound transmission and reflection properties of obstacles and walls in a modeled environment. The outputs of the source channel blocks are combined and provided to single reverberation block generating both the early reflections and the late reverberation for all sound sources.

25 Claims, 5 Drawing Sheets

ENVIRONMENTAL REVERBERATION PROCESSOR

CROSS-REFERENCES TO RELATED APPLICATIONS

This application is a Continuation of and claims priority from U.S. application Ser. No. 09/782,908, filed Feb. 12, 2001, now U.S. Pat. No. 6,917,686 which is a Continuation of and claims priority from U.S. application Ser. No. 09/441,141, filed Nov. 12, 1999, and which issued as U.S. Pat. No. 6,188,769 B1 on Feb. 13, 2001, which claims priority from U.S. Provisional Application No. 60/108,244, filed Nov. 13, 1998, which applications are incorporated herein by reference.

BACKGROUND OF THE INVENTION

Virtual auditory displays (including computer games, virtual reality systems or computer music workstations) create virtual worlds in which a virtual listener can hear sounds generated from sound sources within these worlds. In addition to reproducing sound as generated by the source, the computer also processes the source signal to simulate the effects of the virtual environment on the sound emitted by the source. In a computer game, the player hears the sound that he/she would hear if he/she were located in the position of the virtual listener in the virtual world.

One important environmental factor is reverberation, which refers to the reflections of the generated sound which bounce off objects in the environment. Reverberation can be characterized by measurable criteria, such as the reverberation time, which is a measure of the time it takes for the reflections to become imperceptible. Computer generated sounds without reverberation sound dead or dry.

Reverberation processing is well-known in the art and is described in an article by Jot et al. entitled "*Analysis and Synthesis of Room Reverberation Based on a Statistical Time-Frequency Model*", presented at the 103rd Convention of the Audio Engineering Society, 60 East 42nd St. N.Y., N.Y., 10165-2520.

As depicted in FIG. 1, a model of reverberation presented in Jot et al. breaks the reverberation effects into discrete time segments. The first signal that reaches the listener is the direct signal which undergoes no reflections. Subsequently, a series of discrete "early" reflections are received during an initial period of the reverberation response. Finally, after a critical time, the "late" reverberation is modeled statistically because of the combination and overlapping of the various reflections. The magnitudes of Reflections_delay and Reverb_delay are typically dependent on the size of the room and on the position of the source and the listener in the room.

FIG. 14 of Jot et al. depicts a reverberation model (Room) that breaks the reverberation process into "early", "cluster", and "reverb" phases. In this model, a single feed from the sound source is provided to the Room module. The early module is a delay unit producing several delayed copies of the mono input signal which are used to render the early reflections and feed subsequent stages of the reverberator. A Pan module can be used for directional distribution of the direct sound and the early reflections and for diffuse rendering of the late reverberation decay.

In the system of FIG. 14 of Jot et al. the source signal is fed to early block $R_1$ and a reverb block $R_3$ for reverberation processing and then fed to a pan block to add directionality. Thus, processing multiple source feeds requires implementing blocks $R_1$ and $R_3$ for each source. The implementation of these blocks is computationally costly and thus the total cost can become prohibitive on available processors for more than a few sound sources.

Other systems utilize angular panning of the direct sound and a fraction of the reverberation or sophisticated reverberation algorithms providing individual control of each early reflection in time, intensity, and direction, according to the geometry and physical characteristics of the room boundaries, the position and directivity patterns of the source, and the listening setup.

Research continues in methods to create realistic sounds in virtual reality and gaming environments.

SUMMARY OF THE INVENTION

According to one aspect of the invention, a method and system processes individual sounds to realistically render, over headphones or 2 or more loudspeakers, a sound scene representing multiple sound sources at different positions relative to a listener located in a room. Each sound source is processed by an associated source channel block to generate processed signals which are combined and processed by a single reverberation block to reduce computational complexity.

According to another aspect, each sound source provides several feeds which are sent separately to an early reflection block and a late reverberation block.

According to another aspect of the invention, the early reflection feed is encoded in multi-channel format to allow a different distribution of reflections for each individual source channel characterized by a different intensity and spectrum, different time delay and different direction of arrival relative to the listener.

According to another aspect of the invention, the late reverberation block provides a different reverberation intensity and spectrum for each source.

According to another aspect of the invention, the intensity and direction of the reflections and late reverberation are automatically adjusted according to the position and directivity of the sound sources, relative the position and orientation of the listener.

According to another aspect of the invention, the intensity and direction of the reflections and late reverberation are automatically adjusted to simulate muffling effects due to occlusion by walls located between the source and listener and obstruction due to diffraction around obstacles located between the source and the listener.

Additional features and advantages of the invention will be apparent in view of the following detailed description and appended drawings.

DESCRIPTION OF THE SPECIFIC EMBODIMENTS

Figure 2:
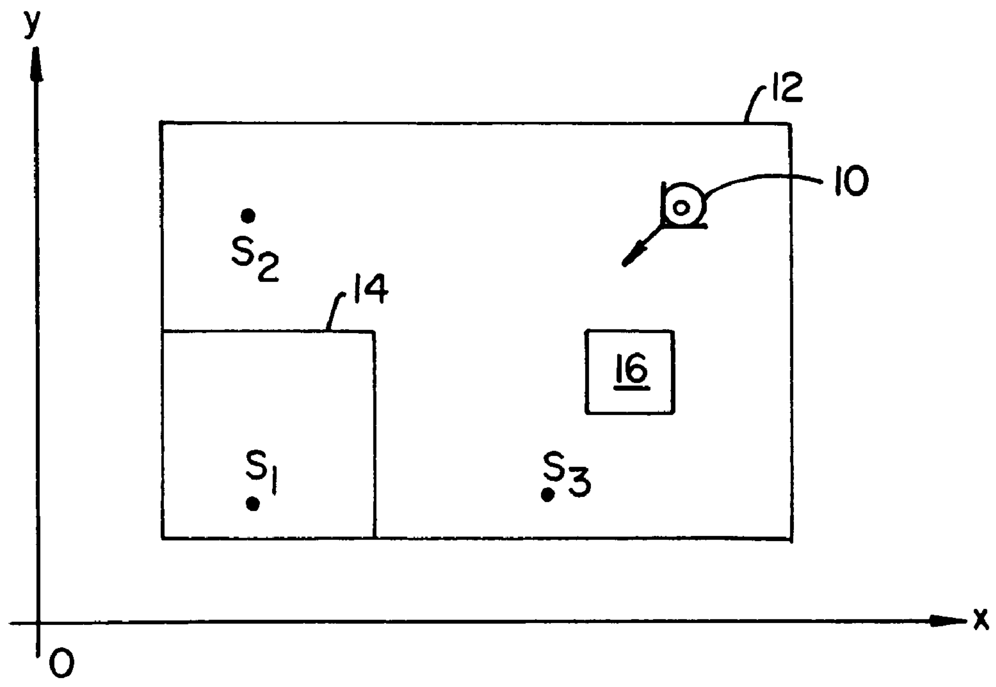
FIG. 2 is a diagram representing a typical sound scene.

The present invention is a system for processing sounds from multiple sources to render a sound scene representing the multiple sounds at different positions in a room. FIG. 2 depicts a sound scene that can be rendered by embodiments of the present invention.

In FIG. 2 a listener 10 is located in a room 12. The room 12 includes a smaller room 14 and an obstacle in the form of a rectangular cabinet 16. A first sound source S1 is located in the small room 14 and second and third sound sources S2 and S3 are located in the large room 12. The location of the listener, sound sources, walls and obstacles are defined relative to a coordinate system (shown in FIG. 2 as an x,y grid). In the real world the sound sources can have a directivity, the sounds would reflect off the walls to create reverberation, the sound waves would undergo diffraction around obstacles, and be attenuated when passing through walls.

Figure 3:
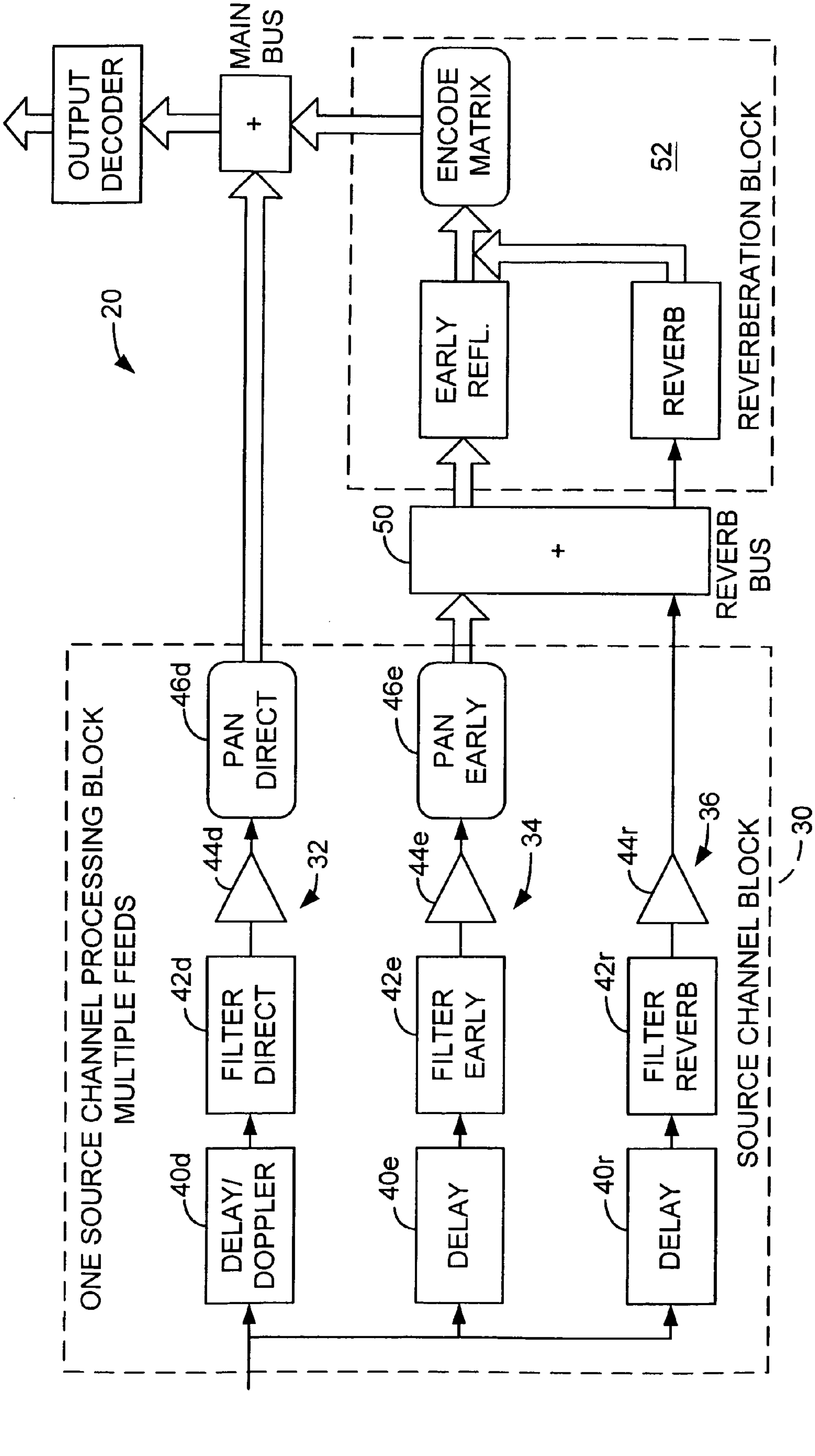
FIG. 3 is a high-level diagram of a preferred embodiment of the invention.

FIG. 3 depicts an embodiment of the general reverberation processing model 20 of the present invention for rendering a sound scene. In FIG. 3 the processing for only one source channel block 30 is depicted. The incoming source channel block is broken into separate feeds for the direct, early reflection, and late reverberation paths 32, 34, and 36. Each path includes a variable delay, low-pass filter, and attenuation element 40, 42, and 44. The direct and early filter paths include pan units 46 to add directionality to the signals. If additional sources are to be processed then additional source channel blocks are added (not shown), one for each source. However, the signals from each source channel block are combined on a reverb bus 50 and routed to the single reverberation block 52 which implements early reflections and late reverberation.

Figure 4:
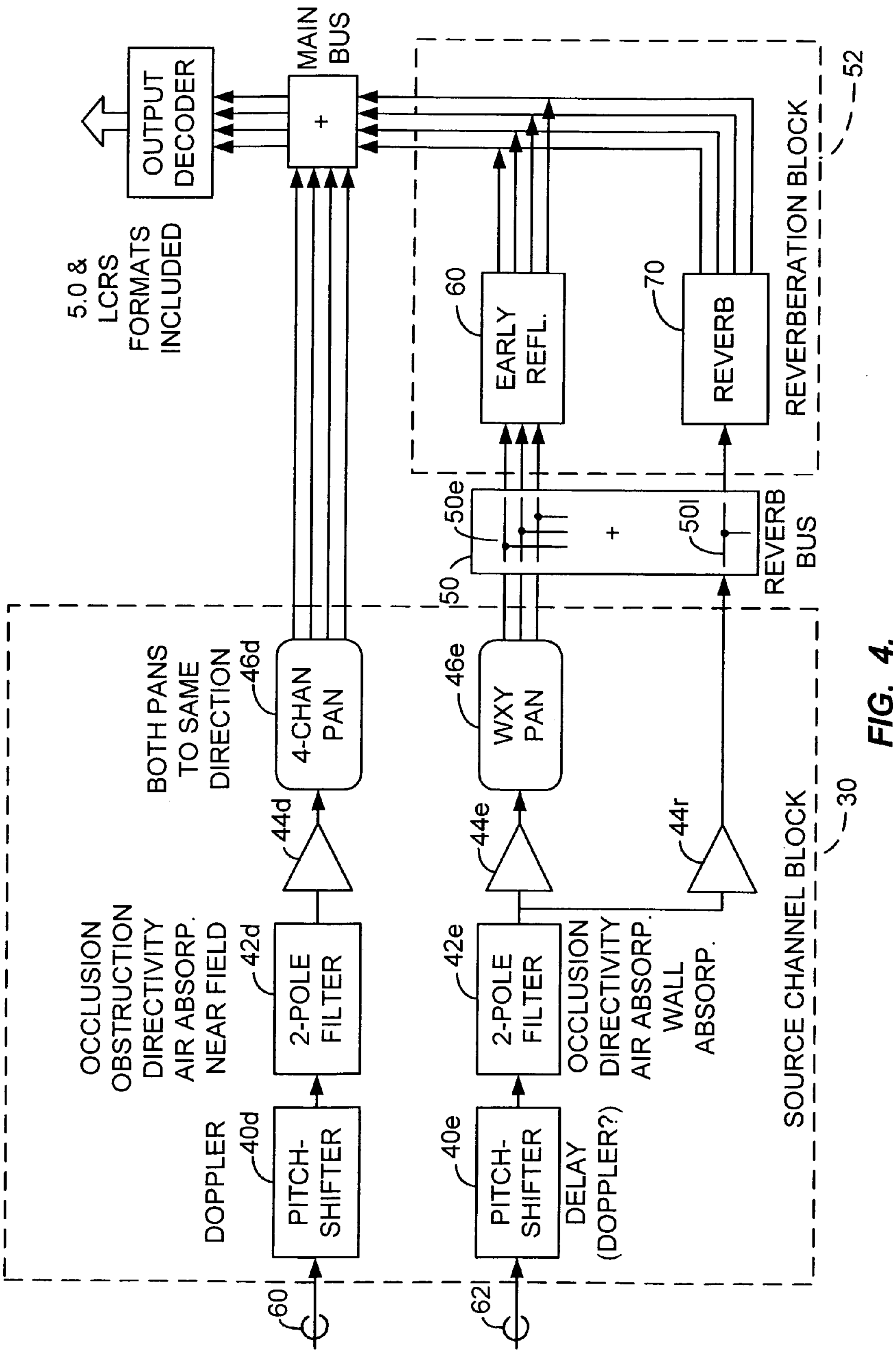
FIG. 4 is an implementation of the system of FIG. 3.

FIG. 4 depicts a particular implementation of the model depicted in FIG. 3. In FIGS. 3 and 4, the early reflection path 34 uses a 3-channel directional encoding scheme (W,L,R) and the dry signal (direct path) uses a 4-channel discrete panning technique. The same source signal feeds the two source channel block inputs 60 and 62 on the left of FIG. 4. Doppler effect or pitch shifting may be implemented in the delay blocks 40. Reproducing the Doppler effect is useful to simulate the motion of a sound source towards or away from the listener. The reverb bus 50 includes a early sub-bus 50*e* for combining multi-channel outputs from early paths 34 in multiple source channel blocks and also includes a late reverberation line 501 for combining the single channel outputs of late reverberation paths 34 of multiple source channel blocks. The reverberation block 52 includes an early reflection block 60 coupled to the early sub-bus 50*e* to receive the combined outputs of the early path of each source channel block. The reverberation block 52 also includes a late reverberation block coupled to the late reverberation line 501 to receive the combined outputs to the late reverberation path of each source channel block.

The control parameters for controlling the magnitudes of the delay, the transfer function of the low-pass filter, and the level of attenuation are indicated in FIG. 4. These control parameters are passed from an application to the reverberation processing model 20.

Figure 1:
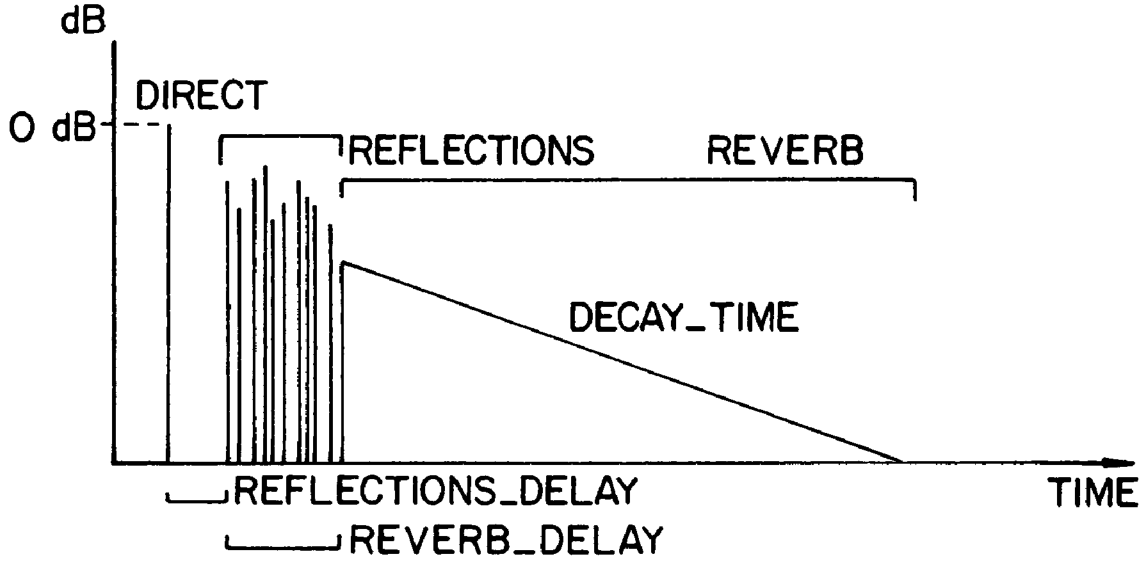
FIG. 1 is a graph depicting the time and intensities of the direct sound, early reflections, and late reverberation components.

The delay elements 40 implement the temporal division between the reverberation sections labeled Direct (Direct path 32), Reflections (early reflection path 34), and Reverb (late reverberation path 36) depicted in FIG. 1.

The processing model for each sound source comprises an attenuation 44 and a low-pass filter 42 that are applied independently to the direct path 32 and the reflected sound 34 as depicted in FIGS. 3 and 4. All the sound-source properties have the effect of adjusting these attenuation and filter parameters.

In one embodiment of the invention, all spectral effects are controlled by specifying an attenuation at a reference high frequency of 5 kHz. All low-pass effects are specified as high-frequency attenuations in dB relative to low frequencies. This manner of controlling low-pass effects is similar to a using a graphic equalizer (controlling levels in fixed frequency bands). It allows the sound designer to predict the overall effect of combined (cascaded) low-pass filtering effects by adding together the resulting attenuations at 5 kHz. This method of specifying low-pass filters is also used in the definition of the Occlusion and Obstruction properties and in the source directivity model as described below.

The "Direct filter" 42*d* is a low-pass filter that affects the Direct component by reducing its energy at high frequencies. The "Room filter" 42*e* in FIG. 4 is a low-pass filter that affects the Reverberation component by reducing its energy at high frequencies.

As is well known in the art, multi-channel signals are fed to loudspeaker arrays to simulate 3-dimensional audio effects. These 3-dimensional effects can also be encoded into stereo signals for headphones. In FIG. 3, the early reflection path feed is encoded in a multi-channel format to allow rendering a different distribution of early reflections for each source channel which is characterized by a different direction of arrival with respect to the listener.

Figure 5:
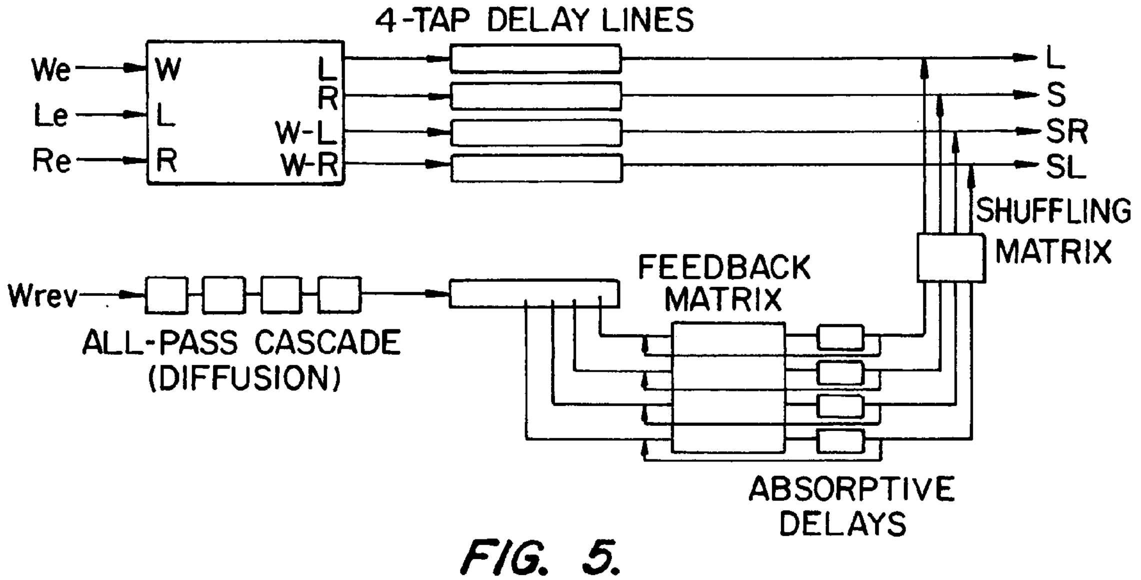
FIG. 5 is an implementation of the early reflection and late reverberation blocks.

FIG. 5 depicts a detailed implementation of the early reflection and reverb blocks included in the reverberation block 52 of FIG. 4. In FIG. 5, in the early reflection block 60, the filtered early reflection feed is input to an early encoder 62 which has the 3-channel (W,L,R) signal as an input a 4-channel (L,R,W-L,W-R), which function as the left, right, surround right, and surround left signals (L,R,SR,SL), as an output. Each channel of the 4-channel output signal in input into a 4-tap delay line 64 to implement successive early reflections.

In the late reverberation block 70, the filtered W channel of the source signal is input through an all-pass cascade (diffusion) filter 72 to a tapped delay line 74 inputting delayed feeds as a 4-channel input signal into a feedback matrix 76 including absorptive delay elements 78. The 4-channel output of the feedback matrix is input to a shuffling matrix 80 which outputs a 4-channel signal which is added to the (L,R,SR,SL) outputs of the early reflection block.

Effects of Obstacles and Partitions

The magnitude of each signal is adjusted according to whether it propagates through walls or diffracts around obstacles.

Occlusion occurs when a wall that separates two environments comes between source and listener, e.g., the wall separating S1 from the listener 10 in FIG. 2. Occlusion of sound is caused by a partition or wall separating two environments (rooms). There's no open-air sound path for sound to go from source to listener, so the sound source is completely muffled because it's transmitted through the wall. Sounds that are in a different room or environment can reach the listener's environment by transmission through walls or by traveling through any openings between the sound source's and the listener's environments. Before these sounds reach the listener's environment they have been affected by the transmission or diffraction effects, therefore both the direct sound and the contribution by the sound to the reflected sound in the listener's environment are muffled. In addition to this, the element which actually radiates sound in the listener's environment is not the original sound source but the wall or the aperture through which the sound is transmitted. As a result, the reverberation generated by the source in the listener's room is usually more attenuated by occlusion than the direct component because the actual radiating element is more directive than the original source.

Obstruction occurs when source and listener are in the same room but there is an object directly between them. There is no direct sound path from source to listener, but the reverberation comes to the listener essentially unaffected. The result is altered direct-path sound with unaltered reverberation. The Direct path can reach the listener via diffraction around the obstacle and/or via transmission through the obstacle. In both cases, the direct path is muffled (low-pass filtered) but the reflected sound form that source is unaffected (because the source radiates in the listener's environment and the reverberation is not blocked by the obstacle). Most often the transmitted sound is negligible and the low-pass effect only depends on the position of the source and listener relative to the obstacle, not on the transmission coefficient of the material. In the case of a highly transmissive obstacle (such as a curtain), however, the sound that goes through the obstacle may not be negligible compared to the sound that goes around it.

Additionally, different adjustments are made at different frequencies to model the frequency-dependent effects of occlusion and obstruction on the signals.

Environment Properties

In a preferred embodiment, the reverberation block of FIG. 3 or FIG. 4 is controlled by seven parameters, or "Environment properties":

- Environment_size: a characteristic dimension of the room, measured in meters,
- Reflections_dB: the intensity of the early reflections, measured in dB,
- Reflections_delay: the delay of the first reflection relative to the direct path,
- Reverb_dB: the intensity of the late reverberation at low frequencies, measured in dB,
- Reverb_delay: the delay of the late reverberation relative to the first reflection,
- Decay_time: the time it takes for the late reverberation to decay by 60 dB at low frequencies,
- Decay_HF_ratio: the ratio of high-frequency decay time re. low-frequency decay time, The values of these parameters may be grouped in presets to implement a particular Environment, e.g., a padded cell, a cave, or a stone corridor. In addition to these properties, toggle flags may be set to TRUE or FALSE by the program to implement certain effects when the value of the Environment_size property is modified. The following is a list of the flags utilized in a preferred embodiment.

| Flag name | type | Default value |
|---|---|---|
| Decay__time__scale | | |
| Reflections__dB__scale | | |
| Reflections__delay__scale | | |
| Reverb__dB__scale | | |
| Reverb__delay__scale | | |

If one of these flags is set to TRUE, the value of the corresponding property is affected by adjustments of the Environment_size property. Changing Environment_size causes a proportional change in all Times or Delays and an adjustment of the Reflections and Reverb levels. Whenever Environment_size is multiplied by a certain factor, the other Environment properties are modified as follows:

- if Reflections_delay_scale is TRUE, Reflections_delay is multiplied by the same factor (multiplying size by 2=>Reflections_delay is multiplied by 2)
- if Reverb_delay_scale is TRUE, Reverb_delay is multiplied by the same factor.
- if Decay_time_scale is TRUE, Decay_time is multiplied by the same factor.
- if Reflections_dB_scale is TRUE, Reflections_dB is corrected as follows:
- if Reflections_delay_scale is FALSE, Reflections is not changed.
- otherwise, Reflections_dB=Reflections_dB−20*log10 (factor).
- if Reverb_scale is TRUE, Reverb_dB is corrected as follows:
- if Decay_time_scale is TRUE, Reverb_dB=Reverb_dB−20*log10(factor).
- if Decay_time_scale is FALSE, Reverb_dB=Reverb_dB−30*log10(factor).

Sound Source Properties

The following list describes the sound source properties, which, in a prefered embodiment of the present invention, control the filtering and attenuation parameters in the source channel block for each individual sound source:

- dist: source to listener distance in meters, clamped within [min_dist, max_dist].
- min_dist, max_dist: minimum and maximum source-listener distances in meters.
- Air_abs_HF_dB: attenuation in dB due to air absorption at 5 kHz for a distance of 1 meter.
- ROF: roll-off factor allowing to adjust the geometrical attenuation of sound intensity vs. distance. ROF=1.0 to simulate the natural attenuation of 6 dB per doubling of distance.
- Room_ROF: roll-off factor allowing to exagerate the attenuation of reverberation vs. distance.
- Obst_dB: amount of attenuation at 5 kHz due to obstruction.
- Obst_LF_ratio: relative attenuation at 0 Hz (or low frequencies) due to obstruction.
- Occl_dB: amount of attenuation at 5 kHz due to occlusion.
- Occl_LF_ratio: relative attenuation at 0 Hz (or low frequencies) due to obstruction.
- Occl_Room_ratio: relative ratio of additional attenuation applied to the reverberation due to occlusion.

Figure 6:
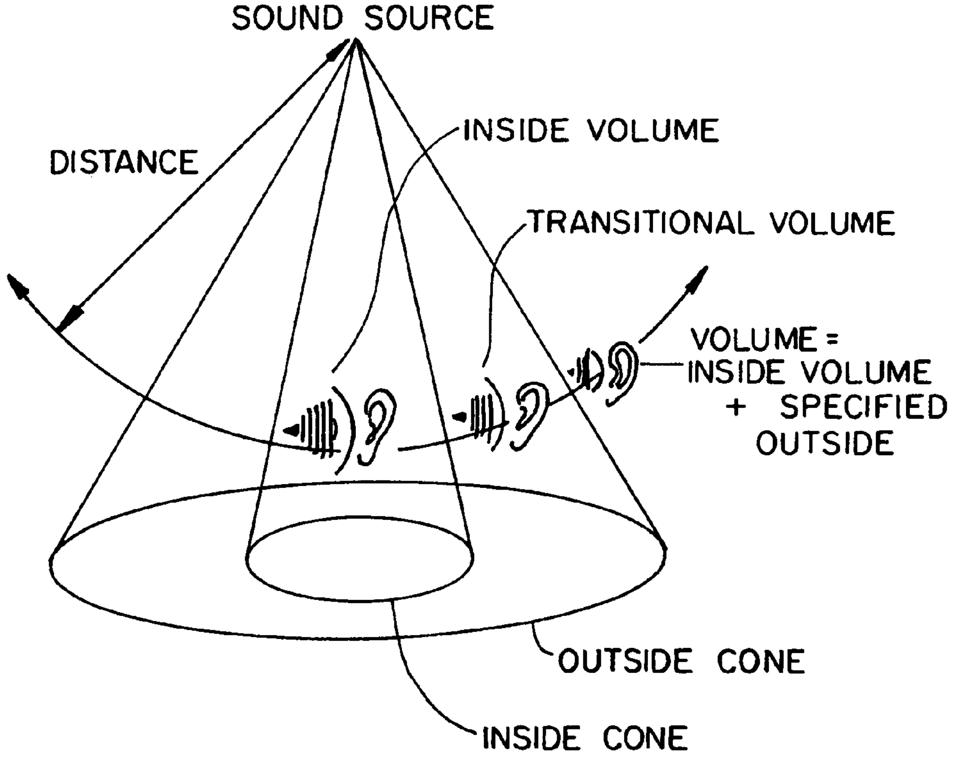
FIG. 6 is a depiction of the sound cones defining directivity.

The directivity of a sound source is modeled by considering inside and outside sound cones as depicted in FIG. 6, with the following properties:

- Inside_angle.
- Outside_angle.
- Inside_volume_dB.
- Outside_volume_dB.
- Outside_volume_HF_dB: relative outside volume attenuation in dB at 5 kHz vs. 0 Hz.

Within the inside cone, defined by Inside_angle, the volume of the sound is the same as it would be if there were no cone, that is the Inside_volume_dB is equal to the volume of an omni directional source. In the outside cone, defined by an Outside_angle, the volume is attenuated by Outside_volume_dB. The volume of the sound between Inside_angle and Outside_angle transitions from the inside volume to the outside volume. A source radiates its maximum intensity within the Inside Cone (in front of the source) and its minimum intensity in the Outside Cone (in back of the source). A sound source can be made more directive by making the Outside_angle wider or by reducing the Outside_volume_dB.

Source Channel Control Equations

The following equations control the filtering and attenuation parameters in the source channel block for each individual sound source, according to the values of the Source and Environment properties, in a prefered embodiment depicted in FIG. 4.

The direct-path filter and attenuation 42*d* and 44*d* in FIG. 4 combine to provide different attenuations at 0 Hz and 5 kHz for the direct path, denoted respectively direct__0 Hz_dB and direct__5 kHz_dB, where:

direct__0 Hz_dB=−20*log10((min_dist+ROF*(dist−min_dist) )/min_dist) +Occl_dB*Occl_LF_ratio +Obst_dB*Obst_LF_ratio +direct__0 Hz_radiation_dB; and direct__5 kHz_dB=−20*log10((min_dist+ROF*(dist−min_dist))/min_dist) +Air_abs_HF_dB*Air_abs_factor*ROF*(dist−min_dist) +Occl_dB +Obst_dB +direct__5 kHz_radiation_dB.

In the above expression of direct__0 Hz_dB, direct__0 Hz_radiation_dB is a function of the source position and orientation, listener position, source inside and outside cone angles and Outside_volume_dB. Direct__0 Hz_radiation_dB is equal to 0 dB for an omnidirectional source. In the expression of direct__5 kHz_dB, direct__5 kHz_radiation_dB is computed in the same way, except that Outside_volume_dB is replaced by (Outside_volume_dB+Outside_volume_HF_dB).

The reverberation filter and attenuation 42*e* and 44*r* in FIG. 4 combine to provide different attenuations at 0 Hz and 5 kHz for the reverberation, denoted respectively room__0 Hz_dB and room__5 kHz_dB, where:

room__0 Hz_dB=−20*log10((min_dist+Room_ROF*(dist−min_dist))/min_dist)−60*ROF*(dist−min_dist)/(*c*0*Decay_time)+min(Occl_dB*(Occl_LF_ratio+Occl_Room_ratio), room__0 Hz_radiation_dB); and room__5 kHz_dB=−20*log10((min_dist+Room_ROF*(dist−min _dist))/min_dist)+Air_abs_HF_dB*ROF*(dist−min_dist)−60*ROF*(dist−min_dist)/(*c*0*Decay_time__5 kHz)+min(Occl_dB*(1+Occl_Room_ratio), room__5 kHz_radiation_dB);

and c0 is the speed of sound (=340 m/s).

In the expression of room__0 Hz_dB, room__0 Hz_radiation_dB is obtained by integrating source power over all directions around the source. It is equal to 0 dB for an omnidirectional source. An approximation of room__0 Hz_radiation_dB is obtained by defining a “median angle” (Mang) as shown in the equations below, where angles are measured from the front axis direction of the source:

room__0 Hz_radiation_dB=10*log10([1−cos(Mang)+Opow*(1+cos(Mang))]/2);

where:

Mang=[Iang+Opow*Oang]/[1+Opow];

Iang, Oang: inside and outside cone angles expressed in radians;

Opow=10^(Outside_volume/10).

In the expression of room__5 kHz_dB, room__5 kHz_radiation_dB is computed in the same way as room__0 Hz_radiation_dB, with:

Opow=10^([Outside_volume+Outside_volume HF__]/10).

The more directive the source, the more the reverberation is attenuated. When Occlusion is set strong enough, the directivity of the source no longer affects the reverberation level and spectrum. As Occlusion is increased, the directivity of the source is progressively replaced by the directivity of the wall (which we assume to be frequency independent).

The early reflection attenuation 44*e* in FIG. 4 provide an attenuation for the early reflections, denoted early__0 Hz_dB, where:

early__0 Hz_dB=room__0 Hz_dB−20*log10((min_dist+ROF*(dist−min_dist))/min_dist).

Figure 7:
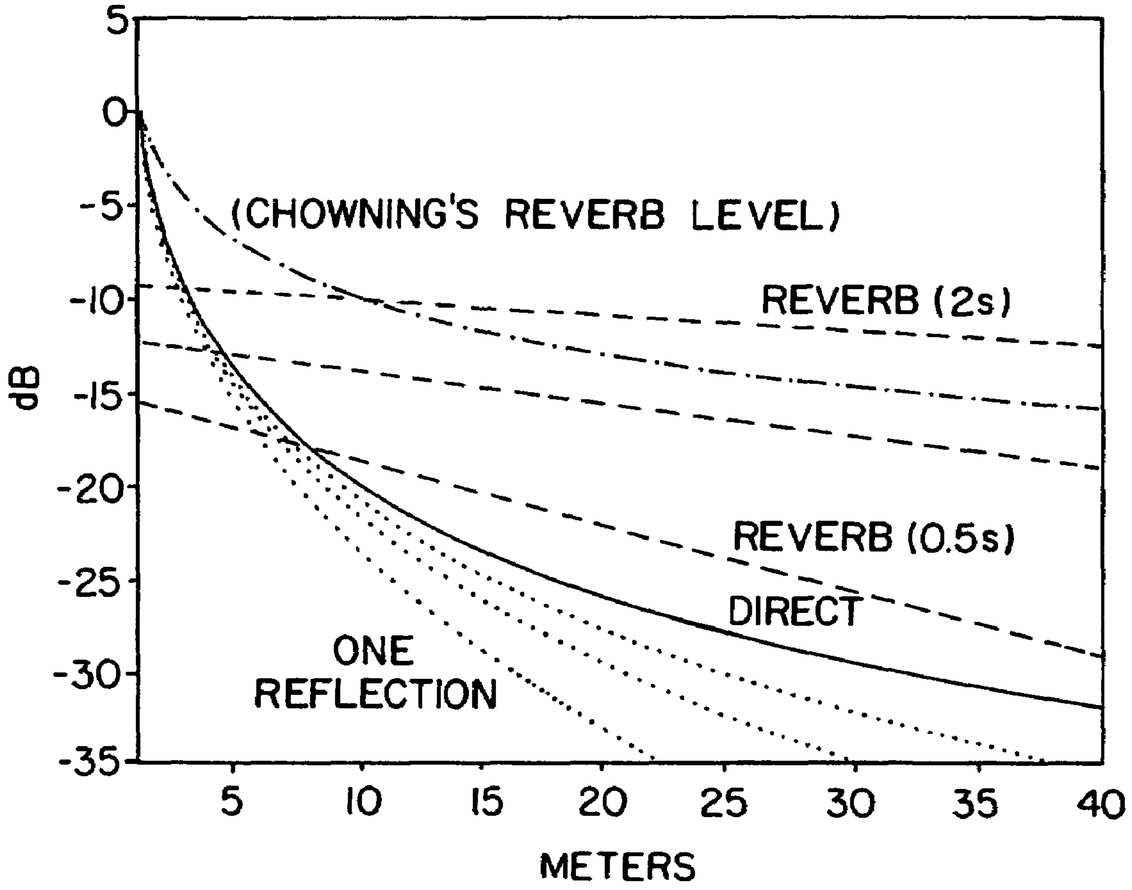
FIG. 7 is a graph depicting the intensities of the direct path, reverberation, and one reflection vs. source-listener distance for an omni-directional sound source.

FIG. 7 illustrates the variation in intensity of the direct path, the late reverberation and one reflection vs. source-listener distance for an omni-directional source, when ROF=1.0 and Room_ROF=0.0. The variation depends on the reverberation decay time and volume of the room. The reverberation intensity at 0 distance is proportional to the decay time divided by the room volume (in cubic meters).

The invention has now been described with reference to the preferred embodiments. In a preferred embodiment the invention is implemented in software for controlling hardware of a sound card utilized in a computer. As is well-known in the art the invention can be implemented utilizing various mixes of software and hardware. Further, the particular parameters and formulas are provided as examples and are not limiting. The techniques of the invention can be extended to model other environmental features. Accordingly, it is not intended to limit the invention except as provided by the appended claims.

What is claimed is:

1. A method for controlling a reverberation block to simulate the acoustic effects of a change in room size, the reverberation block comprising an early reflections module and a reverberation module and the method comprising:

in the early reflections module, controlling an intensity of early reflections responsive to a reflection_intensity parameter; and controlling a delay of a first reflection relative to a direct path responsive to a reflection_delay parameter;

in the reverberation module, controlling an intensity of a late reverberation signal responsive to a reverb_intensity parameter;

controlling a delay of the late reverberation signal relative to a first reflection or to the direct path responsive to a reverb_delay parameter; and controlling a rate of decay of the late reverberation signal responsive to a reverb_decay parameter;

changing a room_size parameter by a selected factor; and in response to the changed room_size parameter, changing a magnitude of at least one of the reflection_delay, reverb_delay and reverb_decay parameters by a magnitude determined by the selected factor; and changing a magnitude of at least one of reflection_intensity and reverb_intensity parameters by a magnitude determined by the selected factor.

2. The method of claim 1, which comprises receiving a plurality of source feeds from each of a plurality of sound sources, each source feed providing an early feed to a common early reflections module, and a late feed to a common reverberation module, the early feed and the late feed being separate feeds.

3. The method of claim 1, which comprises controlling at least one of the intensity of early reflections and the intensity of the late reverberation signal as a decaying function in response to a change in room size.

4. The method of claim 1, which comprises, controlling the delay of the first reflection relative to the direct path as a proportional function in response to a change in room size.

5. The method of claim 1, which comprises controlling the delay of the late reverberation signal relative to one of the first reflection and the direct path as a proportional function in response to a change in room size.

6. The method of claim 1, which comprises controlling the rate of decay of the late reverberation signal as a proportional function in response to a change in room size.

7. A method for controlling a reverberation block to simulate the acoustic effects of a change in room size, the reverberation block comprising a reverberation module and the method comprising:

in the reverberation block, controlling an intensity of a late reverberation signal responsive to a magnitude of a reverb_intensity parameter;

controlling a delay of the late reverberation signal relative to a direct path responsive to a reverb_delay parameter;

controlling a duration of decay of the late reverberation signal responsive to a reverb_decay time parameter, changing the magnitude of a room_size parameter by a selected factor; and in response to the changed room_size parameter, changing a magnitude of at least one of the reverb_decay_time and reverb_delay parameters by a magnitude that is a proportional function of the selected factor; and changing a magnitude of the reverb_intensity parameter by a magnitude that is a decaying function of the selected factor.

8. The method of claim 7, which comprises receiving a plurality of source feeds from each of a plurality of sound sources, each source feed providing an early feed to a common early reflections module, and a late feed to a common reverberation module, the early feed and the late feed being separate feeds.

9. The method of claim 7, which comprises controlling the intensity of the late reverberation signal as a decaying function in response to a change in room size.

10. The method of claim 7, which comprises controlling one of the rate of decay of the late reverberation signal and the delay of the late reverberation signal relative to a direct path as a proportional function in response to a change in room size.

11. A method for controlling a reverberation block to simulate the acoustic effects of a change in room size, with the reverberation block including an early reflections module and the method comprising:

controlling an intensity of early reflections responsive to a reflection_intensity parameter;

controlling the delay of a first reflection relative to a direct path responsive to a reflection_delay parameter;

changing a magnitude of a room_size parameter by a selected factor; and in response to the changed room_size parameter, changing a magnitude of the reflection_delay parameter by a magnitude that is a proportional function of the selected factor; and changing a magnitude of the reflections_intensity parameter by a magnitude that is a decaying function of the selected factor.

12. The method of claim 11, which comprises receiving a plurality of source feeds from each of a plurality of sound sources, each source feed providing an early feed to the early reflections module and separate direct feed, the early feed and the direct feed being separate feeds.

13. The method of claim 11, which comprises one of controlling the intensity of early reflections as a decaying function in response to a change in room size, and controlling the delay of a first reflection relative to a direct path as a proportional function in response to a change in room size.

14. A method, performed by a digital computer, of simulating the effects on direct sound and reverberation of one of an obstruction and an occlusion, said method comprising:

receiving a plurality of source feeds from each of a plurality of sound sources, each source feed providing a direct feed and a reverberation feed, the direct feed and the reverberation feed being separate feeds;

for each of the plurality of source feeds:

when the obstruction is caused by an object located between a sound source and a listener, attenuating a magnitude of only the direct feed by a magnitude determined by a magnitude of an obstruction parameter to simulate the effects of the obstruction; and when the occlusion is caused by a wall located between the sound source and the listener, attenuating a magnitude of both the direct feed and reverberation feed by a magnitude of an occlusion parameter to simulate the effect of the occlusion; and processing the reverberation feed of all the source feeds using a common reverberation unit.

15. The method of claim 14, which includes at least one of low-pass filtering the direct feed and low-pass filtering both the direct feed and the reverberation feed.

16. A method for rendering a sound scene representing a plurality of sound sources, each of the sound sources to be rendered at a different position in the scene, said method comprising:

receiving a plurality of source feeds from each of a plurality of sound sources, each sound source being associated with a different position in the scene, each source feed providing an early feed and a late feed, the early feed and the late feed being separate feeds;

for each of the plurality of source feeds:

processing the early feed of each source feed separately using early reflection signal parameters to produce a processed early feed;

processing the late feed of each source feed separately using late reverberation signal parameters to produce a processed late feed; and controlling an amount of early reflections and an amount of late reverberation separately for each source feed based on the early reflection and the reverberation signal parameters for the different position of each source feed, and for the plurality of sound sources:

processing the processed early feeds with a common early reflection unit to form at least one multi-source early reflection signal; and processing the processed late feeds with a common reverberation unit to form at least one multi-source late reverberation signal, and wherein the method further includes combining the at least one multi-source early reflection signal and the at least one multi-source late reverberation signal to form a processed multi-source output signal.

17. The method of claim 16, which includes for each of the plurality of source feeds:

processing a direct feed using at least one direct signal parameter to form a processed direct feed;

combining the processed direct feeds from each source feed to form a combined direct feed; and combining the combined direct feed with the at least one multi-source early reflection signal and the at least one multi-source late reverberation signal to form the processed multi-source output signal.

18. The method of claim 17, wherein processing the direct feed comprises one of attenuating the direct feed, delaying the direct feed, filtering the direct feed, and panning the direct feed.

19. The method of claim 16, wherein processing the early feed comprises one of attenuating the early feed, delaying the early feed, filtering the early feed, and panning the early feed.

20. The method of claim 16, wherein processing the early feed comprises encoding each early feed in a multi-channel format to allow a different distribution of early reflections for each source feed.

21. The method of claim 16, wherein processing the late feed comprises one of attenuating the late feed, delaying the late feed and filtering the late feed.

22. The method of claim 16, which comprises:

combining the processed early feeds;

combining the processed late feeds; and processing the combined processed early feeds and the combined processed late feeds in a common reverberation block including the common early reflection unit and the common reverberation unit that are common to all source feeds.

23. A computer-readable medium that stores instructions for execution by one or more processors to render a sound scene representing a plurality of sound sources, each of the sound sources to be rendered at a different position in the scene, the one or more processors being configured to:

receive a plurality of source feeds from each of a plurality of sound sources, each of the sound sources associated a different position in the scene, each source feed providing an early feed and a late feed, the early feed and the late feed being separate feeds;

for each of the plurality of source feeds:

process the early feed of each source feed separately using early reflection signal parameters to produce a processed early feed;

process the late feed of each source feed separately using late reverberation signal parameters to produce a processed late feed; and control an amount of early reflections and an amount of late reverberation separately for each source feed based on the early reflection and late reverberation signal parameters for the different position of each source feed, and for the plurality of sound sources:

process the processed early feeds with a common early reflection unit to form at least one multi-source early reflection signal; and process the processed late feeds with a common reverberation unit to form at least one multi-source late reverberation signal, and combine the at least one multi-source early reflection signal and the at least one multi-source late reverberation signal to form a processed multi-source output signal.

24. A reverberation block to simulate the acoustic effects of a change in room size, with the reverberation block including an early reflections module and a reverberation module wherein the early reflections module comprises:

means for controlling an intensity of early reflections responsive to a reflection intensity parameter; and means for controlling the delay of a first reflection relative to a direct path responsive to a reflection_delay parameter, and wherein the reverberation module comprises:

means for controlling an intensity of a late reverberation signal responsive to a reverb_intensity parameter;

means for controlling a delay of the late reverberation signal relative to a first reflection or to the direct path responsive to a reverb_delay parameter;

means for controlling a rate of decay of the late reverberation signal responsive to a reverb_decay parameter;

means for changing a magnitude of a room_size parameter by a selected factor; and means for changing a magnitude of the reflection_delay parameter by a magnitude that is an increasing function of the selected factor in response to the changed room_size parameter; and means for changing a magnitude of the reflections_intensity parameter by a magnitude that is a decaying function of the selected factor in response to the changed room_size parameter.

25. The reverberation block of claim 24, wherein the intensity of early reflections is controlled as a decaying function in response to a change in room size, and the rate of decay of the late reverberation signal of decay is controlled as a proportional function in response to a change in room size.

* * * * *

UNITED STATES PATENT AND TRADEMARK OFFICE

CERTIFICATE OF CORRECTION

PATENT NO. : 7,561,699 B2 
APPLICATION NO. : 10/973152
DATED : July 14, 2009
INVENTOR(S) : Jean-Marc M. Jot et al.

It is certified that error appears in the above-identified patent and that said Letters Patent is hereby corrected as shown below:

On the Title Pg, Item (75), in "Inventors", line 1, delete "Jean-Marc Jot," and insert -- Jean-Mare M. Jot, --, therefor.

On the Title Pg, Item (75), in "Inventors", lines 2-3, delete "Luke Dahl," and insert -- Luke S. Dahl, --, therefor.

In column 6, line 10, after "2)" insert -- . --.

In column 6, line 44, delete "exagerate" and insert -- exaggerate --, therefor.

In column 8, lines 7-8, delete "Opow=10^([Outside_volume+Outside_volume HF_]/10)." and insert -- Opow=10^([Outside_volume+Outside_volume_HF]/10). --, therefor.

In column 12, line 23, in Claim 24, delete "reflection intensity" and insert -- reflection_intensity --, therefor.

In column 12, line 36, in Claim 24, delete "and" and insert -- and; --, therefor.

Signed and Sealed this

Sixth Day of October, 2009

David J. Kappos

*Director of the United States Patent and Trademark Office*